(12) United States Patent
Pan et al.

(10) Patent No.: US 9,306,571 B2
(45) Date of Patent: Apr. 5, 2016

(54) MULTIPLE VOLTAGE INPUT BUFFER AND RELATED METHOD

(71) Applicant: Taiwan Semiconductor Manufacturing Company, Ltd., Hsin-Chu (TW)

(72) Inventors: Lei Pan, Shanghai (CN); Qingchao Meng, Shanghai (CN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 169 days.

(21) Appl. No.: 14/034,113

(22) Filed: Sep. 23, 2013

(65) Prior Publication Data

US 2015/0070070 A1    Mar. 12, 2015

(30) Foreign Application Priority Data

Sep. 11, 2013  (CN) .......................... 2013 1 0412711

(51) Int. Cl.
*H03L 5/00*         (2006.01)
*H03K 19/0185*   (2006.01)

(52) U.S. Cl.
CPC .............. *H03K 19/018507* (2013.01); *H03K 19/018585* (2013.01); *H03K 19/018521* (2013.01)

(58) Field of Classification Search
None
See application file for complete search history.

(56) References Cited

U.S. PATENT DOCUMENTS

| | | | | |
|---|---|---|---|---|
| 5,426,391 A * | 6/1995 | Tedrow | ................. | G11C 16/30 327/530 |
| 6,400,206 B2 * | 6/2002 | Kim et al. | ..................... | 327/333 |
| 7,504,867 B2 * | 3/2009 | Choi et al. | .................... | 327/108 |
| 8,283,965 B2 * | 10/2012 | Alam | ............................ | 327/333 |
| 8,354,873 B2 * | 1/2013 | Ono | ................................ | 327/391 |
| 2006/0006919 A1 * | 1/2006 | Tanaka et al. | ................. | 327/333 |
| 2011/0260770 A1 * | 10/2011 | Sekiguchi | ............ | G01R 31/362 327/333 |
| 2012/0092058 A1 * | 4/2012 | Cooney et al. | ................ | 327/333 |
| 2014/0184300 A1 * | 7/2014 | Wu | ............................... | 327/333 |

* cited by examiner

*Primary Examiner* — Tuan T Lam
(74) *Attorney, Agent, or Firm* — Slater & Matsil, L.L.P.

(57) ABSTRACT

A device includes a first level shifter, a switch, and a control circuit. The first level shifter is electrically connected to a pad. The switch has an input terminal electrically connected to an input terminal of the first level shifter, and an output terminal electrically connected to an output terminal of the first level shifter. The control circuit is electrically connected to a control terminal of the switch.

20 Claims, 5 Drawing Sheets

FIG. 5

MULTIPLE VOLTAGE INPUT BUFFER AND RELATED METHOD

This application claims the benefit of Chinese Application No. 201310412711.5, filed Sep. 11, 2013 which application is hereby incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). Commensurate with shrunken dimensions is a move to lower operating voltages with each successively shrunken node.

Integrated circuits interface with other integrated circuits through input/output (I/O) circuitry. Not all integrated circuits use the same voltage conditions, however. In modern processes, for example, integrated circuits commonly operate at any of 1.8 Volts, 2.5 Volts, and 3.3 Volts. Thus, a 1.8 Volt integrated circuit may boost its voltage output to interface with a 2.5 Volt or 3.3 Volt integrated circuit, and a 3.3 Volt integrated circuit may drop its voltage output to interface with a 2.5 Volt or 1.8 Volt integrated circuit.

Not only do integrated circuits operate at different voltages, but integrated devices within the integrated circuits may also operate at different voltages. Thus, a 1.8 Volt integrated circuit may include core logic devices that operate at 0.9 Volts. The core logic devices are typically faster, and consume less power than standard devices in the 1.8 Volt integrated circuit. Although the core logic devices are faster and consume less power, they are also more fragile, having lower tolerance for high voltage biasing. I/O devices typically operate at higher voltages, such as 3.3 Volts and 1.8 Volts, but have drawbacks of higher power consumption and slower speed. As a result, when an integrated circuit using mainly core logic devices for signal processing is required to interface with a legacy integrated circuit, or an integrated circuit using an older process node (and thus higher nominal operating voltage), I/O devices are used as an interface between the core logic devices and the legacy integrated circuit. Understandably, conversion from the core logic device voltage (0.9 Volts) to the I/O device voltage (1.8 Volts) is required to output the relatively lower voltage signals from the core logic devices to the I/O devices, and another conversion is required to output the voltage signals at the I/O device voltage (1.8 Volts) to the interfaced integrated circuit which operates at a higher voltage (2.5 Volts or 3.3 Volts). Input buffers are used, among other things, to drop higher operating voltages to lower operating voltages, e.g. 3.3 Volts to 0.9 Volts.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely multiple voltage input buffers and methods with beneficial reliability and robustness. Other embodiments may also be applied, however, to other types of input/output (I/O) circuits.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, novel input buffer circuits and methods are introduced. The input buffer circuits use switching control to improve at least reliability and robustness of the input buffer circuits.

Figure 1:
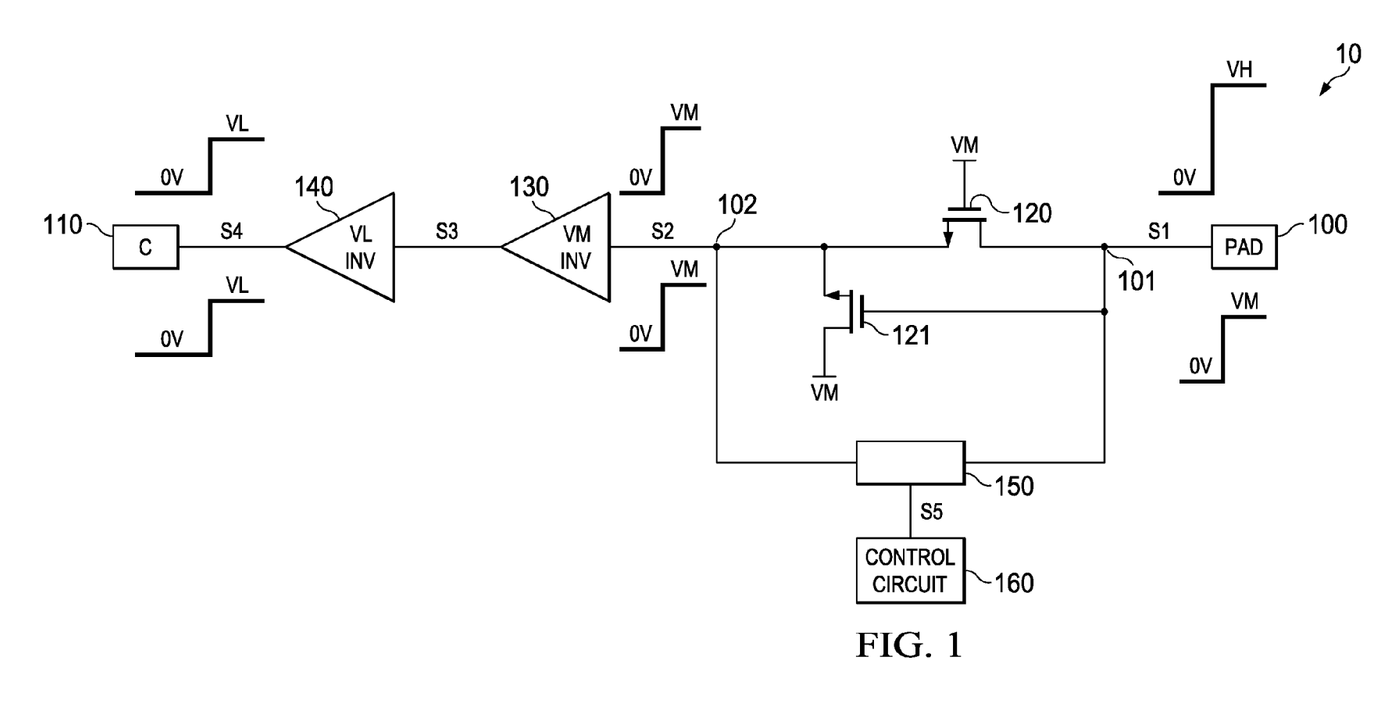
FIG. 1 is a diagram of a multiple voltage input buffer in accordance with various embodiments of the present disclosure.

FIG. 1 is a diagram of a multiple voltage input buffer 10 (or simply, "input buffer 10") in accordance with various embodiments of the present disclosure. In some embodiments, the input buffer 10 is part of an electronic circuit. In some embodiments, the electronic circuit is a transmitter, a receiver, a memory interface, a driver circuit, a readout circuit, or the like. In some embodiments, the electronic circuit is part of a device, such as a wearable electronic device, a smartphone, a tablet computer, a personal computer, network equipment, or the like.

A pad 100 of the input buffer 10 receives input signal S1. First and second transistors 120, 121 convert the input signal S1 to a second signal S2. A first inverter 130 inverts the second signal S2 to generate an inverted signal S3. A second inverter 140 inverts the inverted signal S3 to generate an output signal S4. Core logic 110 receives the output signal S4, and performs further processing on the output signal S4.

In some embodiments, the pad 100 is a metal interconnect structure on an integrated circuit (IC) die for forming an electrical connection with an external circuit on another IC die (e.g., through a printed circuit board trace, through-silicon via, etc.). In some embodiments, the pad 100 is an internal circuit node of the IC die that the input buffer 10 is on. The pad 100 is electrically connected to a first node 101.

In some embodiments, the input buffer 10 operates in an environment requiring support for multiple operating voltage ranges. For example, in secure digital (SD) card and subscriber identity module (SIM) card applications, a host controller is integrated into a silicon-on-a-chip (SOC) including a baseband (BB) and application processor (AP) architecture.

The SOC may be fabricated using an advanced process with lower voltage input/output (I/O) devices (e.g., 1.8V I/O devices). However, SD or SIM protocols require support for transceiver/receiver (Tx/Rx) operation at both 1.8V and 3.3V ranges.

The input signal S1 is in a first range or a second range. The first range is from ground (e.g., 0V) to a high voltage (VH). The second range is from ground (e.g., 0V) to a medium voltage (VM). In some embodiments, the medium voltage is lower than the high voltage by about half (VM=VH/2). In some embodiments, the medium voltage is an operating voltage of a first process node having critical dimension (CD) lower than a second process node corresponding to the high voltage. In some embodiments, the high voltage is about 3.3V and the medium voltage is about 1.8V. In some embodiments, the input signal S1 is a digital signal that has voltage primarily at a logic low voltage (e.g., 0V) or a logic high voltage (e.g., VM or VH), and is not characterized by significant activity (long active periods) between the logic low voltage and the logic high voltage.

In some embodiments, the first transistor 120 is an N-type metal-oxide-semiconductor (NMOS) transistor, and is electrically connected to the node 101 and a node 102. A drain electrode of the first transistor 120 is electrically connected to the node 101. A source electrode of the first transistor 120 is electrically connected to the node 102. A gate electrode of the first transistor 120 is electrically connected to, for example, a first power supply node biased at the medium voltage. In some embodiments, the first power supply node is an output node of a reference bias circuit (e.g., a bandgap reference). In some embodiments, the first power supply node is electrically connected to a regulator circuit.

In some embodiments, the second transistor 121 is an NMOS transistor, and is electrically connected to the node 101 and 102. A source electrode of the second transistor 121 is electrically connected to the node 102. A drain electrode of the second transistor 121 is electrically connected to the first power supply node. A gate electrode of the second transistor 121 is electrically connected to the node 101.

A switch 150 is controlled by a control circuit 160. A first terminal of the switch 150 is electrically connected to the node 101. A second terminal of the switch 150 is electrically connected to the node 102. A control terminal of the switch 150 is electrically connected to an output terminal of the control circuit 160.

For purposes of illustration, operation of the first and second transistors 120, 121 is first described in isolation from activity of the switch 150 and the control circuit 160. In a first operating mode, the input signal S1 varies between ground (e.g., 0V) and the high voltage (e.g., 3.3V). In a second operating mode, the input signal S1 varies between ground and the medium voltage (e.g., 1.8V). When the input signal S1 is about ground, voltage at the node 102 is about ground. In the first operating mode, when the input signal S1 is about the high voltage, the first and second transistors 120, 121 are turned on. The second transistor 121 raises voltage at the node 102 to about the medium voltage. When the node 102 is at about the medium voltage, the first transistor 120 is turned off or weakly turned on (gate-source voltage is less than threshold voltage of the first transistor 120). In the second operating mode, when the input signal S1 is about the medium voltage (voltage at the node 101 is about VM), the gate and drain electrodes of the first and second transistors 120, 121 are all biased at the medium voltage. Voltage at the node 102 eventually stabilizes to about the medium voltage minus the threshold voltage (VM−Vth) of the first or second transistor 120, 121. Dropping the voltage at the node 102 by one threshold voltage (Vth) leaves a very small margin for input to the first inverter 130, which is a Schmitt-trigger inverter in some embodiments. If the medium voltage supplied to the input buffer 10 is reduced only 10% (due to process, temperature, or other variation, for example), function failure at the first inverter 130 is likely.

The switch 150 and the control circuit 160 act at least to mitigate the failure mode just described (too low voltage at the node 102 corresponding to the input terminal of the first inverter 130). In some embodiments, the switch 150 is a P-type metal-oxide-semiconductor (PMOS) transistor. A source electrode of the switch 150 is electrically connected to the node 102. A drain electrode of the switch 150 is electrically connected to the node 101. A gate electrode of the switch 150 is electrically connected to the control circuit 160. When the medium voltage (VM) is detected by the control circuit 160, the switch 150 is turned on (e.g., voltage at the gate electrode is biased to 0V), and the medium voltage is transferred through the switch 150 to the node 102, bypassing the first and second transistors 120, 121. The switch 150 introduces very little to no voltage drop in transferring the medium voltage to the node 102, providing greater margin to the input terminal of the first inverter 130. Thus, even if the medium voltage is reduced by 10% (or more), the first inverter 130 still functions properly.

An input terminal of the first inverter 130 is electrically connected to the node 102 for receiving the second signal S2 from the first and second transistors 120, 121 or the switch 150. The first inverter 130 inverts the second signal S2 (e.g., from VM to 0V or from 0V to VM) to generate the inverted signal S3 at an output terminal of the first inverter 130.

An input terminal of the second inverter 140 is electrically connected to the output terminal of the first inverter 130. The inverted signal S3 is inputted to the input terminal of the second inverter 140. The second inverter 140 inverts the inverted signal S3 to output the output signal S4. For example, the second inverter 140 inverts the third signal S3 from 0 Volts to a low voltage (VL), or from the medium voltage to 0 Volts. The low voltage is lower than the medium voltage. In some embodiments, the low voltage is about 0.9 Volts, the medium voltage is about 1.8 Volts, and the high voltage is about 3.3 Volts. Other voltages are contemplated for the low voltage, the medium voltage, and the high voltage.

Figure 2:
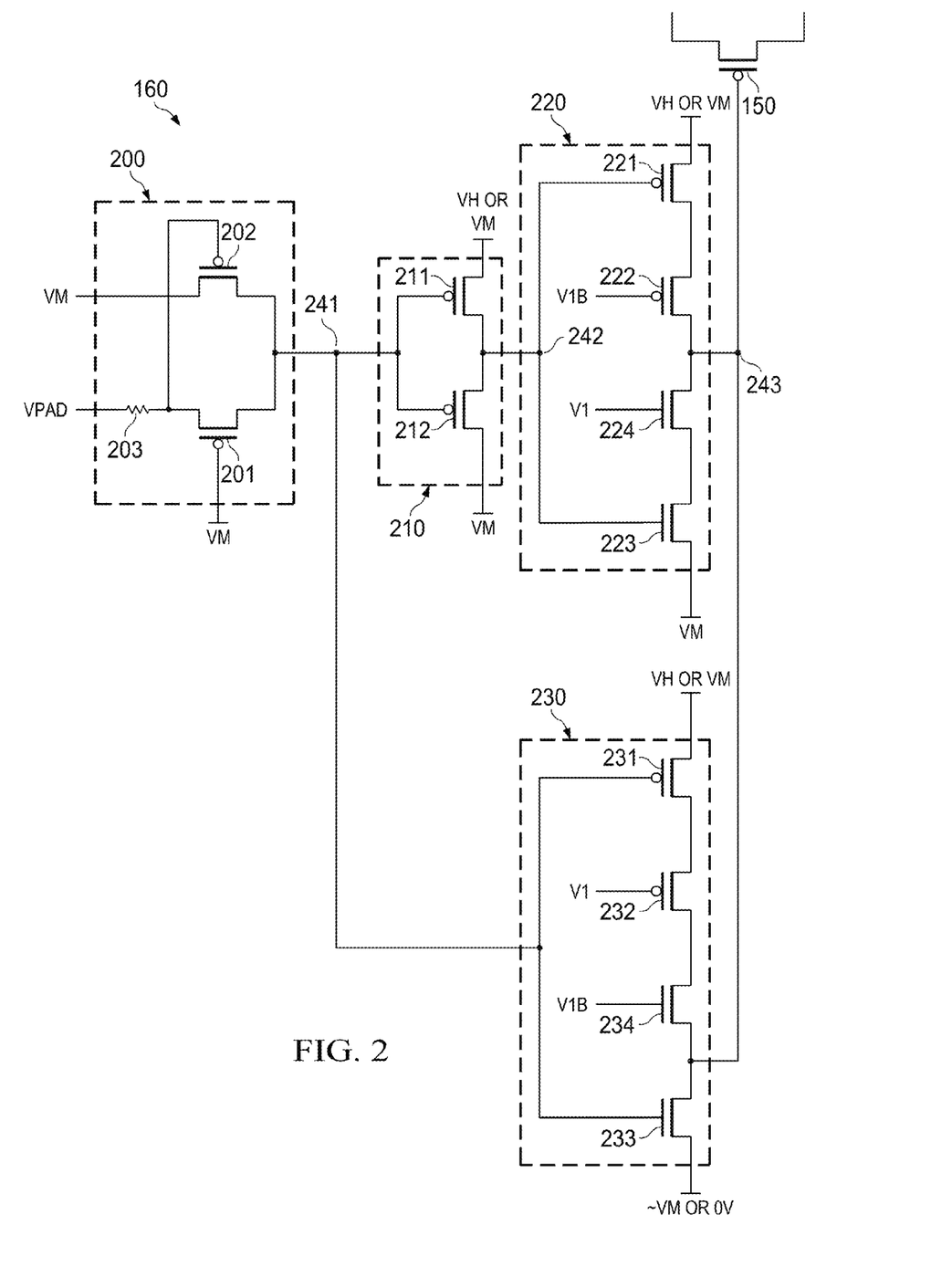
FIG. 2 is a diagram of a control circuit in accordance with various embodiments of the present disclosure.

FIG. 2 is a diagram of the control circuit 160 in accordance with various embodiments of the present disclosure. The switch 150 is also shown for reference in FIG. 2. A detection circuit 200 receives pad voltage (VPAD) of the pad 100, and the medium voltage (VM), and outputs a detection voltage at a node 241. An upper level shifter 220 receives an inverted detection voltage at a node 242 generated by an inverter 210 between the node 241 and the node 242. A lower level shifter 230 receives the detection voltage at the node 241. Voltage at a node 243 corresponding to output terminals of the upper and lower level shifters 220, 230 is received by the gate electrode of the switch 150 to control operation of the switch 150.

The detector circuit 200 receives the pad voltage (VPAD) of the pad 100, and the medium voltage (VM), and outputs the detection voltage at the node 241. A first transistor 201 receives the pad voltage through a resistor 203. A first terminal of the resistor 203 receives the pad voltage. In some embodiments, the first transistor 201 is a PMOS transistor. A drain electrode of the first transistor 201 is electrically connected to a second terminal of the resistor 203. A source electrode of the first transistor 201 is electrically connected to the node 241. A gate electrode of the first transistor 201 is biased by the medium voltage. A second transistor 202 receives the medium voltage. A drain electrode of the second transistor 202 is biased by the medium voltage. A source electrode of the second transistor 202 is electrically connected to the node 241. A gate electrode of the second transistor 202 is electrically connected to the drain electrode of the first transistor 201.

The inverter 210 inverts the detection voltage at the node 241 to generate the inverted detection voltage at the node 242. A first transistor 211 of the inverter 210 is a PMOS transistor. A source electrode of the first transistor 211 receives the high voltage (VH). A drain electrode of the first transistor 211 is electrically connected to the node 242. A gate electrode of the first transistor 211 is electrically connected to the node 241. A second transistor 212 of the inverter 210 is an NMOS transistor. A source electrode of the second transistor 212 is electrically connected to receive the medium voltage. A drain electrode of the second transistor 212 is electrically connected to the node 242. A gate electrode of the second transistor 212 is electrically connected to the node 241.

The upper level shifter 220 receives the inverted detection voltage at the node 242, and level shifts the inverted detection voltage to output the voltage at the node 243. A first transistor 221 and a second transistor 222 of the upper level shifter 220 are PMOS transistors. A gate electrode of the first transistor 221 is electrically connected to the node 242. A source electrode of the first transistor 221 is electrically connected to receive the high voltage. A source electrode of the second transistor 222 is electrically connected to a drain electrode of the first transistor 221. A third transistor 223 and a fourth transistor 224 of the upper level shifter 220 are NMOS transistors. A source electrode of the third transistor 223 is electrically connected to receive the medium voltage. A source electrode of the fourth transistor 224 is electrically connected to a drain electrode of the third transistor 223. A gate electrode of the fourth transistor 224 is electrically connected to receive a control signal (V1). A gate electrode of the second transistor 222 is electrically connected to receive a bar control signal (V1B). In some embodiments, the bar control signal (V1B) has opposite logical level of the control signal (V1). For example, the bar control signal may be 1.8V when the control signal is 3.3V. In another example, the bar control signal may be 1.8V when the control signal is 0V. The second transistor 222 and the fourth transistor 224 form an enable circuit of the upper level shifter 220.

The lower level shifter 230 receives the detection voltage at the node 241, and level shifts the detection voltage to output the voltage at the node 243. A first transistor 231 and a second transistor 232 of the upper level shifter 230 are PMOS transistors. A gate electrode of the first transistor 231 is electrically connected to the node 241. A source electrode of the first transistor 231 is electrically connected to receive the high voltage. A source electrode of the second transistor 232 is electrically connected to a drain electrode of the first transistor 231. A third transistor 233 and a fourth transistor 234 of the upper level shifter 230 are NMOS transistors. A source electrode of the third transistor 233 is electrically connected to receive a voltage that is slightly lower than the medium voltage (~VM) or 0V. A source electrode of the fourth transistor 234 is electrically connected to a drain electrode of the third transistor 233. A gate electrode of the fourth transistor 234 is electrically connected to receive the bar control signal (V1B). A gate electrode of the second transistor 232 is electrically connected to receive the control signal (V1). The second transistor 232 and the fourth transistor 234 form an enable circuit of the lower level shifter 230.

Figure 3:
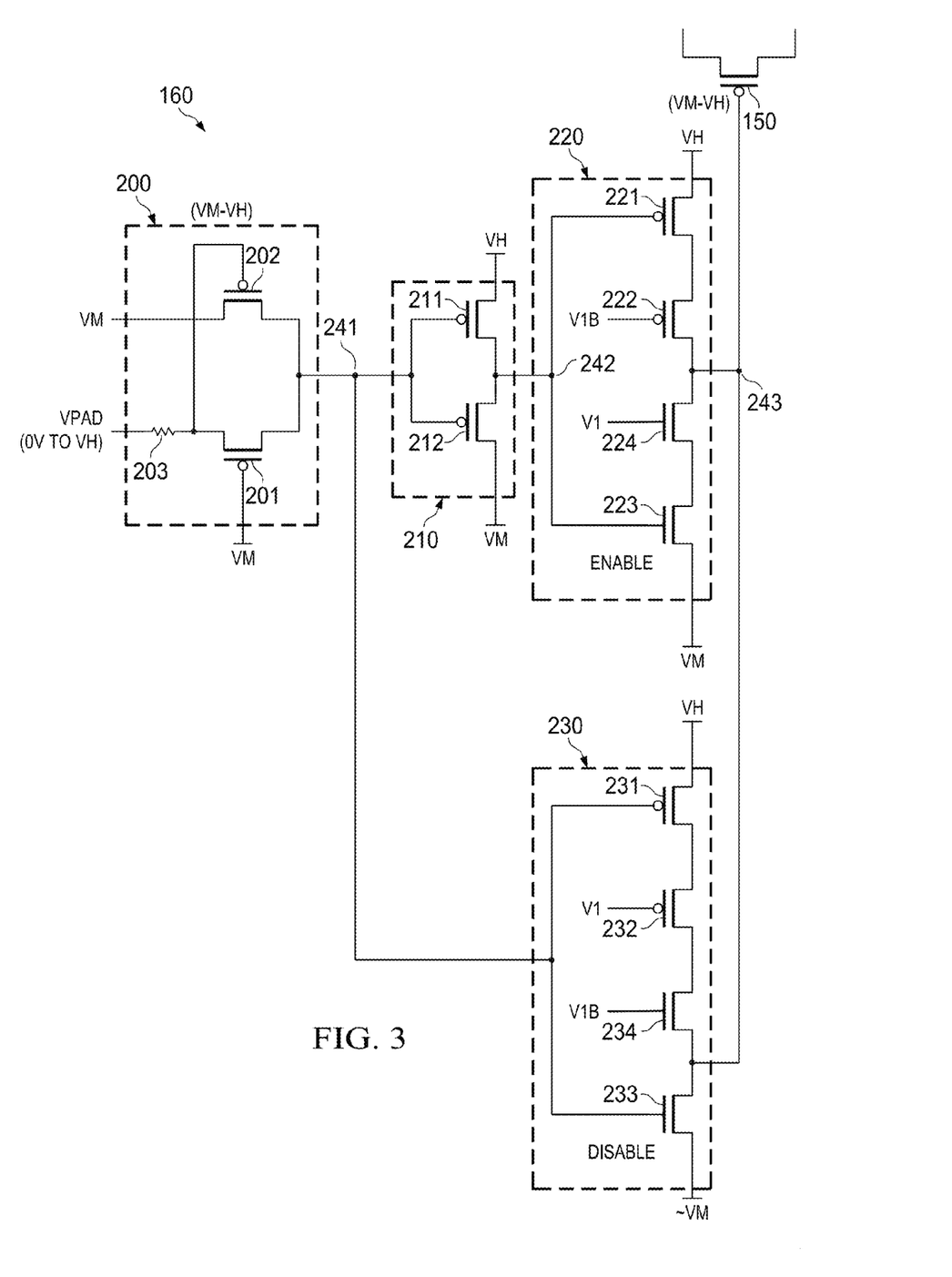
FIG. 3 is a diagram of the control circuit in a first operating mode in accordance with various embodiments of the present disclosure.

FIG. 3 is a diagram of the control circuit 160 in the first operating mode in accordance with various embodiments of the present disclosure. In the first operating mode, the pad voltage VPAD is in the first range (e.g., from about 0 Volts to about 3.3 Volts). The upper level shifter 220 is enabled by setting the control signal to a first voltage level (e.g., 3.3 Volts) higher than at least one threshold voltage of the fourth transistor 224, and setting the bar control signal to a second voltage level (e.g., 1.8 Volts) lower than the high voltage by at least one threshold voltage of the second transistor 222. The lower level shifter 230 is disabled with the control signal and the bar control signal set as just described (gate-source voltage of the fourth transistor 234 is substantially 0 Volts; source-gate voltage of the second transistor 232 is substantially 0 Volts).

When the pad voltage is substantially 0 Volts, the second transistor 202 is turned on to pass the medium voltage to the node 241. The medium voltage at the node 241 turns on the first transistor 211 of the inverter 210 to pass the high voltage to the node 242. The high voltage at the node 242 turns on the third transistor 223 of the upper level shifter 220 to pass the medium voltage through the fourth transistor 224 to the node 243 corresponding to the gate electrode of the switch 150.

When the pad voltage is substantially the high voltage (e.g., 3.3 Volts), the first transistor 201 is turned on to pass the high voltage to the node 241. The high voltage at the node 241 turns on the second transistor 212 of the inverter 210 to pass the medium voltage to the node 242. The medium voltage at the node 242 turns on the first transistor 221 of the upper level shifter 220 to pass the high voltage through the second transistor 222 to the node 243 corresponding to the gate electrode of the switch 150.

In the first operating mode, the control circuit 160 outputs the high voltage when the pad voltage is the high voltage, and the medium voltage when the pad voltage is 0 Volts. This effectively turns off the switch 150. 243 cannot always keep high voltage due to device reliability (HCI and GOI) consideration. When PAD voltage is high voltage, 243 is high voltage, and PMOS 150 reliability is acceptable. While PAD voltage is 0 Volts, 243 voltage must change from high voltage to VM to keep reliability within an acceptable range, as illustrated in FIG. 1 and described above.

Figure 4:
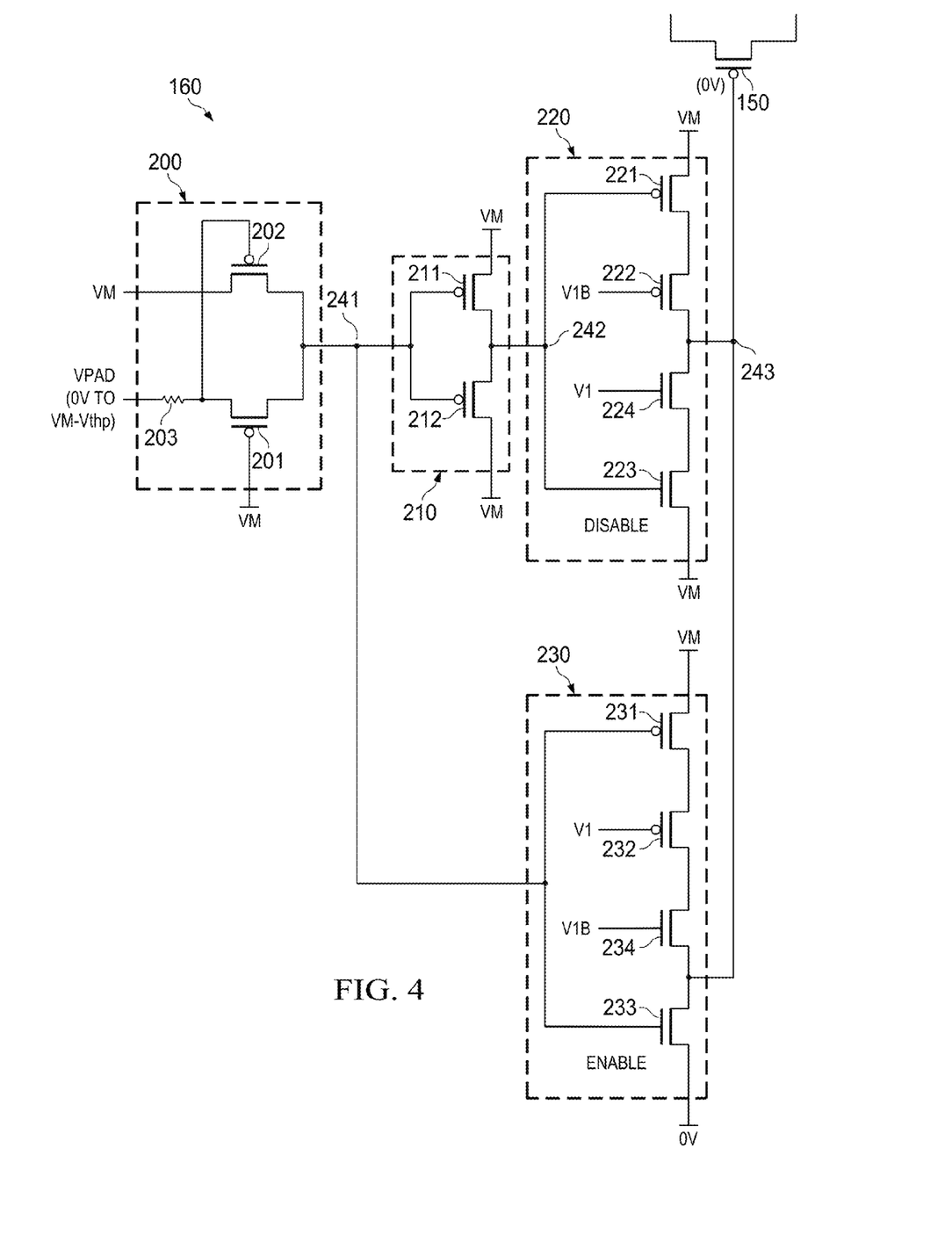
FIG. 4 is a diagram of the control circuit in a second operating mode in accordance with various embodiments of the present disclosure.

FIG. 4 is a diagram of the control circuit 160 in the second operating mode in accordance with various embodiments of the present disclosure. In the second operating mode, the pad voltage VPAD is in the second range (e.g., from about 0 Volts to about 1.8 Volts). The lower level shifter 230 is enabled by setting the control signal to a third voltage level (e.g., 0 Volts) higher than at least one threshold voltage of the fourth transistor 234, and setting the bar control signal to the second voltage level (e.g., 1.8 Volts) lower than the medium voltage by at least one threshold voltage of the second transistor 232. The upper level shifter 220 is disabled with the control signal and the bar control signal set as just described (gate-source voltage of the fourth transistor 224 is substantially 0 Volts; source-gate voltage of the second transistor 222 is substantially 0 Volts).

When the pad voltage is substantially 0 Volts, the second transistor 202 is turned on to pass the medium voltage to the node 241. The medium voltage at the node 241 turns on the third transistor 233 of the lower level shifter 230 to pass 0 Volts through the fourth transistor 234 to the node 243 corresponding to the gate electrode of the switch 150.

When the pad voltage is substantially the medium voltage (e.g., 1.8 Volts), the first transistor 201 is turned on to pass the medium voltage to the node 241. The medium voltage at the node 241 turns on the first transistor 233 of the lower level shifter 230 to pass 0 Volts through the second transistor 234 to the node 243 corresponding to the gate electrode of the switch 150.

In the second operating mode, the control circuit 160 outputs about 0 Volts for the pad voltage being about the medium voltage or about 0 Volts. This effectively turns on the switch 150, as illustrated in FIG. 1 and described above.

Figure 5:
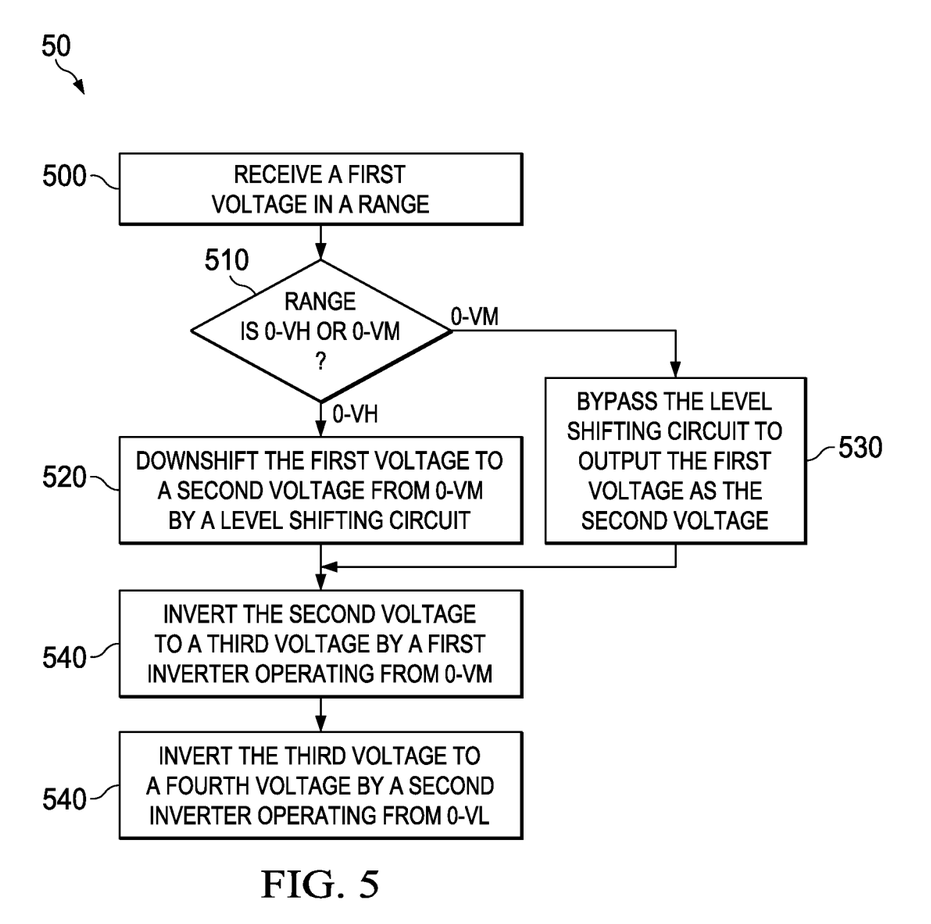
FIG. 5 is a flowchart of a process for performing multiple voltage input buffering in accordance with various embodiments of the present disclosure.

FIG. 5 is a flowchart of a process 50 for performing multiple voltage input buffering in accordance with various embodiments of the present disclosure. The process 50 is described in terms of the input buffer 10 of FIGS. 1-4 for illustrative purposes only. A first voltage is received in step 500. The first voltage is in a range of voltages (e.g., from about a first voltage level to about a second voltage level). In some embodiments, the range is associated with a mode of operation of a circuit. For example, the range may be associated with the first operating mode or the second operating mode described above. In some embodiments, the first voltage is received by the circuit, such as the input buffer 10, from another circuit electrically connected to the circuit. In some embodiments, the external circuit is located in a same IC with the circuit. In some embodiments, the external circuit is located in a different IC electrically connected to an IC on which the circuit is located. In some embodiments, the first voltage is part of a signal. In some embodiments, the first voltage corresponds to a first logical level of the signal. For example, the first voltage may be a logic high voltage or a logic low voltage.

The range of the first voltage is determined in step 510. In some embodiments, the range is determined depending on the circuit operating in the first operating mode or the second operating mode. In some embodiments, a controller biases the circuit to operate in the first operating mode or the second operating mode.

When the range of the first voltage is from about 0 Volts to about the high voltage (e.g., the first range described above), the first voltage is downshifted to a second voltage in a range from about 0 Volts to about the medium voltage VM by a level shifting circuit in step 520. In the first operating mode of the input buffer 10, the downshifting is performed by the first and second transistors 120, 121 in FIG. 1. During operation of the step 520, the control circuit 160 is biased from the high voltage to the medium voltage (as shown in FIG. 3). The control circuit 160 turns off the switch 150 due to the biasing conditions applied and operation of the inverter 210 and the upper level shifter 220.

When the range of the first voltage is from about 0 Volts to about the medium voltage (e.g., the second range described above), the first voltage bypasses the level shifting circuit to be outputted as the second voltage in step 530. In the step 530, the second voltage is substantially equal to the first voltage (minus one source-drain voltage of the switch 150, for example). In the second operating mode of the input buffer 10, the bypassing is performed by the switch 150 in FIG. 1. During operation of the step 530, the control circuit 160 is biased from the medium voltage to about 0 volts (as shown in FIG. 4). The control circuit 160 turns on the switch 150 due to the biasing conditions applied and operation of the lower level shifter 230.

The second voltage obtained in the step 520 or the step 530 is inverted to a third voltage by a first inverter 130 operating from 0 Volts to the medium voltage in step 540. In some embodiments, the first inverter in the step 540 is the first inverter 130 shown in FIG. 1. In some embodiments, when the second voltage is about 0 Volts, the first inverter inverts the second voltage to about the medium voltage (e.g., 1.8 Volts). In some embodiments, when the second voltage is about the medium voltage, the first inverter inverts the second voltage to about 0 Volts.

The third voltage (the medium voltage or 0 Volts) is inverted to a fourth voltage by a second inverter 140 operating from 0 Volts to the low voltage (e.g., 0.9 Volts) in step 550. In some embodiments, the second inverter in the step 540 is the second inverter 140 shown in FIG. 1. In some embodiments, when the third voltage is about 0 Volts, the second inverter inverts the third voltage to about the low voltage (e.g., 0.9 Volts). In some embodiments, when the third voltage is about the medium voltage, the first inverter inverts the second voltage to about 0 Volts.

Embodiments may achieve advantages. The switch 150 introduces little to no voltage drop in transferring the medium voltage to the node 102, providing greater margin to the input terminal of the first inverter 130. Thus, even if the medium voltage is reduced by 10% (or more), the first inverter 130 still functions properly.

In accordance with various embodiments of the present disclosure, a device includes a first level shifter, a switch, and a control circuit. The first level shifter is electrically connected to a pad. The switch has an input terminal electrically connected to an input terminal of the first level shifter, and an output terminal electrically connected to an output terminal of the first level shifter. The control circuit is electrically connected to a control terminal of the switch.

In accordance with various embodiments of the present disclosure, a method includes receiving a voltage by a pad of a device, and sending the voltage to a node by bypassing a level shifting circuit electrically connected to the pad and the node by a switch electrically connected to the pad and the node.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Use of the terms "ground" and "0 Volts" in the above description are intended to provide a frame of reference for discussion of the embodiments. Other frames of reference are contemplated in the embodiments. For example, the first operating range from the high voltage to 0 Volts or ground may be equivalent to another operating range from a lower voltage to a negative voltage (e.g., from 1.8 Volts to −1.8 Volts, from 0.45 Volts to −0.45 Volts, or the like).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to

What is claimed is:

1. A device comprising:
    a first level shifter electrically connected to a pad; and
    a bypass circuit connected in parallel with the first level shifter, comprising:
        an input terminal electrically connected to an input terminal of the first level shifter;
        an output terminal electrically connected to an output terminal of the first level shifter;
        a switch; and
        a control circuit electrically connected to a control terminal of the switch, the control circuit comprising a second level shifter electrically connected to the pad.

2. The device of claim 1, wherein the switch is a P-type metal-oxide-semiconductor (PMOS) transistor.

3. The device of claim 1, further comprising:
    a first inverter having an input terminal electrically connected to the output terminal of the first level shifter; and
    a second inverter having an input terminal electrically connected to an output terminal of the first inverter.

4. The device of claim 3, wherein:
    the pad is electrically connected to a first circuit operating in a first voltage range,
    the second inverter is electrically connected to a second circuit operating in a second voltage range, and
    the first voltage range is larger than the second voltage range.

5. The device of claim 1, wherein the control circuit further comprises an inverter electrically connected to the second level shifter.

6. A device comprising:
    a first level shifter electrically connected to a pad; and
    a bypass circuit connected in parallel with the first level shifter, comprising:
        an input terminal electrically connected to an input terminal of the first level shifter;
        an output terminal electrically connected to an output terminal of the first level shifter;
        a switch; and
        a control circuit electrically connected to a control terminal of the switch, comprising:
            a second level shifter electrically connected to the pad;
            an inverter electrically connected to the second level shifter;
            a third level shifter electrically connected to the inverter and the control terminal of the switch; and
            a fourth level shifter electrically connected to the second level shifter and the control terminal of the switch.

7. The device of claim 6, wherein the second level shifter comprises:
    a first transistor having:
        a first electrode electrically connected to the pad; and
        a second electrode electrically connected to an input terminal of the inverter; and
    a second transistor having:
        a first electrode electrically connected to the input terminal of the inverter; and
        a control electrode electrically connected to the first electrode of the first transistor.

8. The device of claim 7, wherein the second level shifter further comprises:
    a resistor having a first terminal electrically connected to the pad, and a second terminal electrically connected to the first electrode of the first transistor.

9. The device of claim 7, wherein:
    the third level shifter comprises:
        a third transistor having a control electrode electrically connected to an output terminal of the inverter;
        a fourth transistor having a control electrode electrically connected to the output terminal of the inverter; and
        a first enable circuit having a first terminal electrically connected to a first electrode of the third transistor, a second terminal electrically connected to a first electrode of the fourth transistor, and a third terminal electrically connected to the control terminal of the switch; and
    the fourth level shifter comprises:
        a fifth transistor having a control electrode electrically connected to the second electrode of the first transistor of the second level shifter;
        a sixth transistor having a control electrode electrically connected to the second electrode of the first transistor of the second level shifter; and
        a second enable circuit having a first terminal electrically connected to a first electrode of the fifth transistor, a second terminal electrically connected to a first electrode of the sixth transistor, and a third terminal electrically connected to the control terminal of the switch.

10. The device of claim 9, wherein:
    the first enable circuit comprises:
        a seventh transistor having a first electrode electrically connected to the first electrode of the third transistor, and a second electrode electrically connected to the control terminal of the switch; and
        an eighth transistor having a first electrode electrically connected to the first electrode of the fourth transistor, and a second electrode electrically connected to the control terminal of the switch; and
    the second enable circuit comprises:
        a ninth transistor having a first electrode electrically connected to the first electrode of the fifth transistor, and a second electrode electrically connected to the control terminal of the switch; and
        a tenth transistor having a first electrode electrically connected to the first electrode of the sixth transistor, and a second electrode electrically connected to the control terminal of the switch.

11. A method comprising:
    receiving a voltage by a pad of a device;
    determining a voltage range of the voltage; and
    turning on a switch electrically connected to the pad and a node by a control circuit when the voltage range is a smaller range of a first voltage range and a second voltage range, and sending the voltage to the node by bypassing a level shifting circuit electrically connected to the pad and the node.

12. The method of claim 11, wherein the determining includes biasing the control circuit at the voltage range.

13. The method of claim 11, wherein the turning on includes:
    level shifting the voltage of the pad by a first level shifter electrically connected to the pad;
    enabling a second level shifter electrically connected to the first level shifter and the switch; and
    level shifting an output voltage of the first level shifter by the second level shifter to turn on the switch.

14. The method of claim 13, wherein the enabling includes turning on a first transistor and a second transistor of the second level shifter.

15. The method of claim 13, wherein the turning on further includes:
   disabling a third level shifter electrically connected to the switch and to an inverter electrically connected to the first level shifter.

16. The method of claim 15, wherein the disabling includes turning off a first transistor and a second transistor of the third level shifter.

17. The method of claim 10, further comprising:
   disabling the switch when the voltage range is a larger range of the first voltage range and the second voltage range.

18. The method of claim 17, wherein the disabling includes:
   level shifting the voltage of the pad by a first level shifter electrically connected to the pad;
   inverting an output voltage of the first level shifter; and
   level shifting the output voltage of the first level shifter by a third level shifter to turn on the switch.

19. The method of claim 18, wherein the disabling further includes: disabling a second level shifter electrically connected to the first level shifter and the switch.

20. The method of claim 19, wherein the disabling the second level shifter includes:
   turning off a first transistor and a second transistor of the second level shifter.

* * * * *